(12) United States Patent
Mitsui (10) Patent No.: US 9,683,900 B2
(45) Date of Patent: Jun. 20, 2017

(54) TEMPERATURE MEASURING SYSTEM AND TEMPERATURE MEASURING INSTRUMENT

(71) Applicant: Azbil Corporation, Tokyo (JP)

(72) Inventor: Masaki Mitsui, Tokyo (JP)

(73) Assignee: AZBIL CORPORATION, Tokyo (JP)

( * ) Notice: Subject to any disclaimer, the term of this patent is extended or adjusted under 35 U.S.C. 154(b) by 364 days.

(21) Appl. No.: 14/594,287

(22) Filed: Jan. 12, 2015

(65) Prior Publication Data

US 2015/0198486 A1 Jul. 16, 2015

(30) Foreign Application Priority Data

Jan. 16, 2014 (JP) ................................ 2014-005629

(51) Int. Cl.
| | |
|---|---|
| *G01K 7/00* | (2006.01) |
| *G01K 7/16* | (2006.01) |
| *G01K 15/00* | (2006.01) |
| G01K 7/20 | (2006.01) |
| G01R 27/14 | (2006.01) |
| G01K 1/02 | (2006.01) |

(52) U.S. Cl.
CPC ............. *G01K 7/16* (2013.01); *G01K 15/007* (2013.01); *G01K 1/026* (2013.01); *G01K 7/20* (2013.01); *G01K 7/206* (2013.01); *G01R 27/14* (2013.01)

(58) Field of Classification Search
CPC ............ G01K 7/20; G01K 7/206; G01K 7/16; G01K 1/026; G01K 15/00; G01K 15/0007; G01R 27/14

USPC ....... 374/E7.024, 183, 185, E1.005, E7.018; 324/704, 713
See application file for complete search history.

(56) References Cited

U.S. PATENT DOCUMENTS 5,317,520 A * 5/1994 Castle ..................... G01K 7/20
374/172
6,225,802 B1 5/2001 Ramalho et al.
(Continued)

FOREIGN PATENT DOCUMENTS

| JP | 58187875 A | * 11/1983 | ........... G01R 31/026 |
|---|---|---|---|
| JP | H02198327 A | 8/1990 | |

(Continued)

OTHER PUBLICATIONS

Chinese Office Action dated Dec. 6, 2016 issued in corresponding Chinese Patent Application No. 201410856704.9.

*Primary Examiner* — Jonathan Dunlap
(74) *Attorney, Agent, or Firm* — Troutman Sanders LLP (57) ABSTRACT

A temperature measuring instrument is provided with a testing switch that controls a supply of a first constant current to a first signal line from a first constant current source and a supply of a second constant current to a second signal line from a second constant current source. When a temperature is being measured, the first and second constant currents are supplied respectively to the first and second signal lines. When testing connection statuses of the first signal line, the second signal line and a third signal line, the supply of the first and second constant currents are stopped temporarily, to change a report from a current detecting/reporting portion, provided in a temperature sensor, for detecting and reporting whether or not there is a return current to the temperature measuring instrument from the third signal line.

2 Claims, 6 Drawing Sheets

(56) References Cited

U.S. PATENT DOCUMENTS

| | | | | |
|---|---|---|---|---|
| 9,086,442 B2* | 7/2015 | Mayer | .................. | G01R 31/025 |
| 9,228,905 B2* | 1/2016 | Alley | .................. | G01K 15/007 |
| 9,297,846 B2* | 3/2016 | Vulovic | ............... | G01R 31/026 |
| 2008/0279255 A1* | 11/2008 | Burmeister | .............. | G01K 7/20 |
| | | | | 374/185 |
| 2013/0293241 A1* | 11/2013 | Mayer | .................. | G01R 31/025 |
| | | | | 324/510 |
| 2014/0056329 A1* | 2/2014 | Alley | ....................... | G01K 7/20 |
| | | | | 374/185 |
| 2016/0047852 A1* | 2/2016 | Poisson | .................. | G01R 17/12 |
| | | | | 324/522 |

FOREIGN PATENT DOCUMENTS

| | | | |
|---|---|---|---|
| JP | 08247857 A | * | 9/1996 |
| JP | H09-105681 | | 4/1997 |
| JP | 2000241258 A | | 9/2000 |
| JP | 2008191131 A | * | 8/2008 |
| JP | 2008-249351 A | | 10/2008 |
| JP | 2011242349 A | * | 12/2011 |
| JP | 2012-242294 | | 12/2012 |

* cited by examiner

TEMPERATURE MEASURING SYSTEM AND TEMPERATURE MEASURING INSTRUMENT

CROSS REFERENCE TO RELATED APPLICATION

This application claims priority under 35 U.S.C. §119 to Japanese Patent Application No. 2014-005629, filed on Jan. 16, 2014, the entire content of which being hereby incorporated herein by reference.

FIELD OF TECHNOLOGY

The present invention relates to a temperature measuring technology, and, in particular, to a connection status testing technology for testing statuses of signal lines for connecting temperature sensors and temperature measuring instruments.

BACKGROUND

As a technology for measuring temperatures using temperature sensors that use temperature measuring resistive elements, a three-line temperature measuring technology has been proposed. See, for example, Japanese Unexamined Patent Application Publication Nos. H09-105681 and 2012-242294.

This three-line temperature measuring technology is a temperature measuring technology for measuring a temperature through connecting, through a three-line signal cable, a temperature sensor, which houses a temperature measuring resistive element, and a temperature measuring instrument, and supplying, through these signal lines, a constant current from the temperature measuring instrument to the temperature measuring resistive element.

Figure 6:
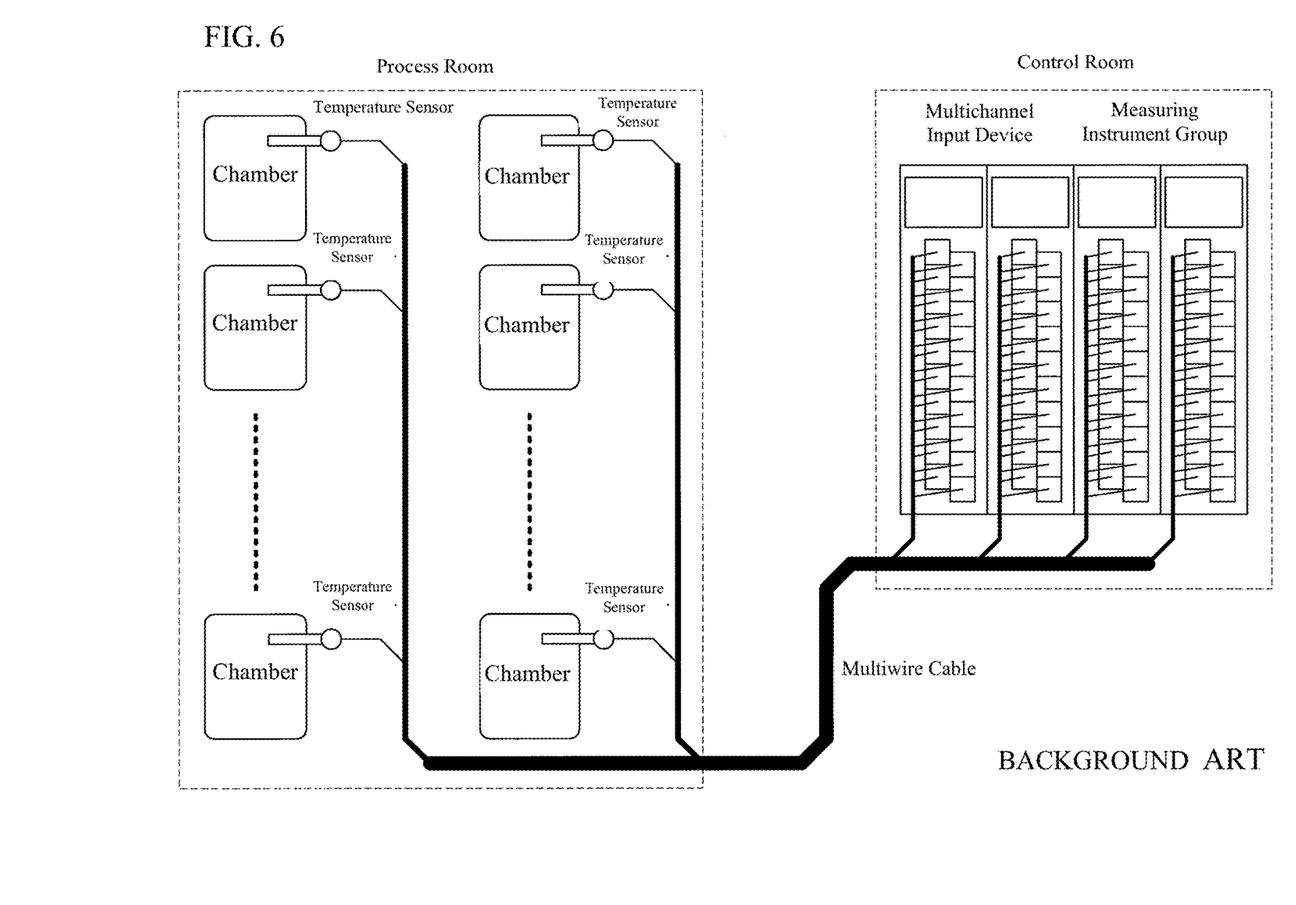
FIG. 6 is an example of a typical three-line temperature measuring system interconnection.

FIG. 6 is an example of a typical three-line temperature measuring system interconnection. As illustrated in FIG. 6, when measuring the temperature within a facility, such as an industrial plant or a building, using such a three-line temperature measuring system, a multiwire cable is used as a signal line from temperature sensors that are disposed in various locations within a processing room, to connect to multichannel input instruments and measuring instruments, and to connect to temperature measuring instruments that are disposed in a control room.

Consequently, in a case wherein the temperature measuring instruments can handle multiple channels, a total of, for example, 30 signal lines, from, for example, 10 temperature sensors, are connected to respective ports for the individual channels, provided in a centralized temperature measuring instrument. Because of this, it is necessary to confirm whether or not the signal lines are connected without error to the ports corresponding to the respective channels.

However, normally, the temperature measuring instrument is disposed in a control room, and thus, conventionally, technicians are deployed in both the control room and in the remote location wherein the temperature sensors are installed, to use testing devices, such as conductivity testers, to perform operations for checking the connections of the individual signal lines.

Because of this, there is a problem in that checking the connections for the temperature sensors requires substantial time and labor.

The present invention is to solve issues such as these, and an aspect thereof is to provide a connection checking technology able to reduce greatly the amount of time and labor required in checking the connections of the temperature sensors.

SUMMARY

In order to achieve such an aspect, a temperature measuring system according to the present invention includes: a temperature sensor having a temperature measuring resistive element; and a temperature measuring instrument that supplies a constant current to the temperature measuring resistive element through a first signal line connected to one end of the temperature measuring resistive element and second and third signal lines connected to the other end of the temperature measuring resistive element, and outputs a measured temperature based on a voltage difference produced between the first signal line and the second signal line. The temperature measuring instrument includes: a first current source that supplies a first constant current that returns to the third signal line through the temperature measuring resistive element of the temperature sensor from the first signal line; a second constant current source that supplies a second constant current that returns to the third signal line from the second signal line; and a testing switch that supplies the first constant current from the first constant current source to the first signal line and the second constant current from the second constant current source to the second signal line. The temperature sensor includes a current detecting/reporting portion that detects and reports whether or not there is a return current from the third signal line to the temperature measuring instrument. The testing switch supplies the first and second constant currents to the first and second signal lines, respectively, when the temperature is being measured, and, when the connection statuses of the first, second, and third signal lines are being tested, temporarily stops the supply of the first constant current and of the second constant current, to change the report from the current detecting/reporting portion.

Moreover, a temperature measuring instrument according to the present invention, supplies a constant current to a temperature measuring resistive element through a first signal line connected to one end of a temperature measuring resistive element of a temperature sensor, and second and third signal lines connected to the other end of the temperature measuring resistive element, and outputs a measured temperature based on a voltage difference produced between the first signal line and the second signal line. The temperature measuring instrument includes: a first current source that supplies a first constant current that returns to the third signal line through the temperature measuring resistive element of the temperature sensor from the first signal line; a second constant current source that supplies a second constant current that returns to the third signal line from the second signal line; and a testing switch that supplies the first constant current from the first constant current source to the first signal line and the second constant current from the second constant current source to the second signal line. The testing switch supplies the first and second constant currents to the first and second signal lines, respectively, when the temperature is being measured, and, when the connection statuses of the first, second, and third signal lines are being tested, temporarily stops the supply of the first constant current and of the second constant current, to detect whether or not there is a return current that is returned to the temperature measuring instrument from the third signal line to change the report from the current detecting/reporting portion provided at the temperature sensor.

The present invention enables confirmation as to whether or not signal lines are connected properly, depending on whether or not there is a change in a report from the current detecting/reporting portion, in response to the ON/OFF switching of the testing switch, enabling a large reduction in the time and effort required in checking the connections of the temperature sensors.

DETAILED DESCRIPTION

Forms for carrying out the present invention will be explained next in reference to the figures.

Example

Figure 1:
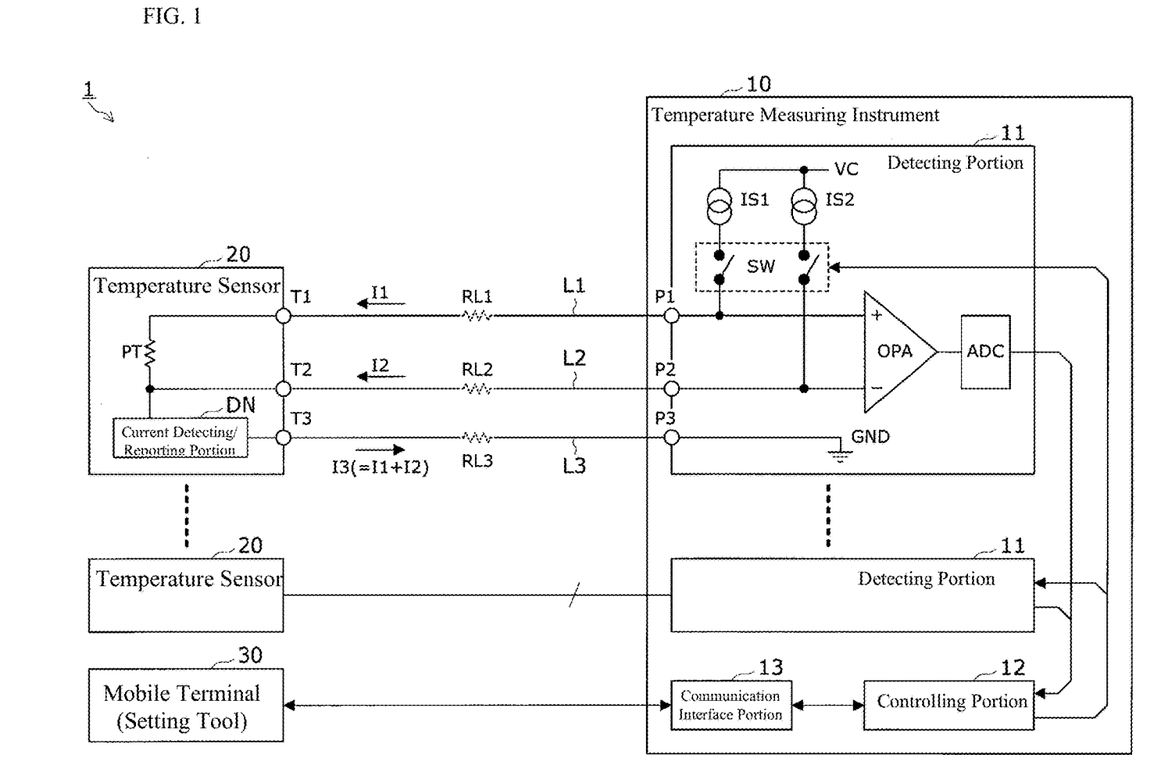
FIG. 1 is a block diagram illustrating a structure of a temperature measuring system according to Example.

A temperature measuring system 1 according to Example according to the present invention will be explained first in reference to FIG. 1. FIG. 1 is a block diagram illustrating a structure of a temperature measuring system according to the Example.

This temperature measuring system 1 is a measuring system used in measuring temperatures in a facility such as an industrial plant for building, or the like, and is structured from a plurality of temperature sensors 20 and temperature measuring instruments 10 for measuring temperatures based a voltage differences across the ends of temperature measuring resistive elements PT that are housed in the temperature sensors 20.

The temperature measuring instrument 10 is made from a controller, as is broadly used in remote control systems, and is provided with a plurality of detecting portions 11, a controlling portion 12, and a communication interface portion 13, as the primary functional portions thereof.

A detecting portion 11 is provided for each temperature sensor 20, and is connected to the corresponding temperature sensor 20 through three lines: a signal line L1 (a first signal line), a signal line L2 (a second signal line), and a signal line L3 (a third signal line). Specifically, terminals P1, P2, and P3 of the detecting portion 11 are connected respectively to terminals T1, T2, and T3 of the temperature sensor 20 through the signal lines L1, L2, and L3.

The detecting portion 11 is provided with constant current sources IS1 and IS2 (first and second constant current sources), a testing switch SW, an op-amp OPA, and an A/D converter ADC, as the primary circuit structures thereof.

The constant current source IS1 has a function for supplying a constant current I1 (a first constant current) from the terminal P1 to the signal line L1 that is connected to one end of the temperature measuring resistive element PT from the power supply voltage VC through the terminal T1.

The constant current source IS2 has a function for supplying a constant current I2 (a second constant current) from the terminal P2 to the signal line L2 that is connected to the other end of the temperature measuring resistive element PT from the power supply voltage VC through the terminal T2.

Moreover, the signal line L3 that is connected to the terminal T3 is connected through a terminal P3 to the ground electropotential GND within the detecting portion 11.

The testing switch SW has a function for being controlled into a conductive (ON) state by the controlling portion 12, when testing the connection statuses of the signal lines L1, L2, and L3, to supply constant currents I1 and I2 from the constant current sources IS1 and IS2 to the respective signal lines L1 and L2 at the time of a temperature measurement, and for being controlled into the open (OFF) state, by the controlling portion 12, to stop temporarily the supply of the constant currents I1 and I2.

The op-amp OPA has a function for outputting a measurement signal that changes depending on the temperature, through detecting and amplifying a voltage difference Vd that is produced between the signal lines L1 and L2 that are connected to the terminals P1 and P2.

The A/D converter ADC has a function for performing A/D conversion, into measured data, of the measurement signal that is outputted from the op-amp OPA, and outputting it to the controlling portion 12.

The controlling portion 12 has a function for detecting the measured data outputted from each of the detecting portions 11 and outputting the temperature data, in response to this measured data, from the communication interface portion 13 to a higher-level device (not shown), and a function for switching the testing switch SW into a conductive state when performing temperature measurements, and for switching the testing switch SW into an open state when testing the connection statuses.

The communication interface portion 13 has a function for performing data communication with a higher-level device that performs processes based on the temperatures detected by the various temperature sensors 20, and communication with various types of external devices, such as a mobile terminal 30 that is used when testing the connection statuses.

The temperature sensor 20 is provided with a temperature measuring resistive element PT and a current detecting/reporting portion DN, as the primary functional portions thereof.

The temperature measuring resistive element PT has one end connected to a signal line L1 through a terminal T1, and the other end connected to a signal line L2 through a terminal T2, and has a function wherein the resistance value thereof changes in accordance with the ambient temperature.

The current detecting/reporting portion DN has an input end connected to the other end of the temperature measuring resistive element PT and an output end connected to a signal line L3 through a terminal T3, and has a function for detecting, and reporting, whether or not there is a return current I3 that is returned from the signal line L3 to the temperature measuring instrument 10.

In the present invention, when testing the connection statuses of the signal lines L1, L2, and L3, a testing switch SW of the detecting portion 11, having received a command from the mobile terminal 30, is switched into an open state by the controlling portion 12, to stop temporarily the supply of the constant current I1 and I2 to the temperature sensor 20, and thus the temporary stopping of the return current I3 that returns to the temperature measuring instrument 10 through the signal line L3 from the temperature sensor 20 changes the report from the current detecting/reporting portion DN. This enables checking the connection status is of the signal lines L1, L2, and L3, as to whether or not they are normal or faulty, depending on whether or not the presence or absence of the return current I3, depending on the ON/OFF status of the testing switch SW, is reported from the current detecting/reporting portion DN.

Temperature Measuring Operation

The temperature measuring operation by the temperature measuring system 1 will be explained first.

When measuring the temperature, the controlling portion 12 causes the testing switch SW of the detecting portion 11 to go into a conductive state, to supply the constant currents I1 and I2 to the signal lines L1 and L2 from the constant current sources IS1 and IS2. As a result, the constant currents I1 and I2 are supplied to the temperature sensor 20, and the return current I3, which is the sum of these, flows to the ground electropotential GND through the signal line L3.

Interconnection resistances RL1, RL2, and RL3 are produced in the signal lines L1, L2, and L3 in accordance with the lengths thereof. If here the resistance value for the temperature measuring resistive element PT is defined as R, then the electropotential V1 of the signal line L1 and the electropotential V2 of the signal line L2, at the input end of the op-amp OPA are expressed by the following equations (1) and (2):

$$V1=I1\times(RL1+R)+(I1+I2)\times RL3 \quad (1)$$

$$V2=I2\times RL2-(I1+I2)\times RL3 \quad (2)$$

At this time, because I1 and I2 will be essentially equal, and typically RL1 and RL2 can be considered to be essentially equal, RL1 and RL2 are defined as RL, and when I1 and I2 are defined as I, then V1 and V2 are as given by Equations (3) and (4) as follows:

$$V1=I\times(RL+R)+2I\times RL3 \quad (3)$$

$$V2=I\times RL+2I\times RL3 \quad (4)$$

Consequently, the voltage difference Vd=V1−V2 at the input end of the op-amp OPA can be calculated by the following Equation (5):

$$Vd=IR \quad (5)$$

As a result, if I=I1=I2 is a constant, then the voltage difference Vd at the input end of the op-amp OPA will change proportionately with the change in the resistance value R of the temperature measuring resistive element PT. Consequently, the op-amp OPA detecting and amplifying Vd makes it possible to obtain a measuring signal that has a voltage that depends on the change in the resistance value R, that is, that depends on the change in temperature.

Connection Status Testing Operation

The connection status testing operation by the temperature measuring system 1 will be explained next.

As illustrated in FIG. 1, in the temperature sensor 20 the constant currents I1 and I2 that are supplied from the signal lines L1 and L2 are returned to the temperature measuring instrument 10 from the signal line L3 as the return current I3, where this return current I3 will have a value that will always be a constant if the connection statuses for the signal lines L1, L2, and L3 are proper. Moreover, the interconnection resistance RL3 of the signal line L3 is absent from Equation (5), so even if there is an increase in the interconnection resistance RL3, it has no effect on the temperature measurement.

The present invention focuses on such characteristics of the return current I3 and the interconnection resistance RL3, where not only is the current detecting/reporting portion DN provided between the other end of the temperature sensor 20 and the signal line L3, but the testing switch SW is provided in the detecting portion 11, so that, when testing the connection statuses, the testing switch SW is put into the open state by the controlling portion 12 to temporarily stop the supply of the constant currents I1 and I2, to thereby cause the current detecting/reporting portion DN to operate.

Figure 2:
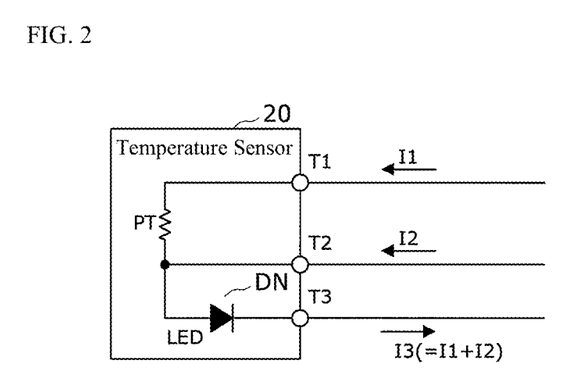
FIG. 2 is an example configuration of a current detecting/reporting portion.

FIG. 2 is an example configuration of a current detecting/reporting portion. Here, as the current detecting/reporting portion DN, a current detecting LED is provided with the anode terminal thereof connected to the other end of the temperature measuring resistive element PT, and the cathode terminal thereof connected to the signal line L3. As a result, when the testing switch SW goes into the conductive state, the flow of the return current I3 causes the current detecting LED to emit light, thereby providing notification that a return current I3 has been detected, and when the testing switch SW goes into the open state, the return current I3 is stopped, and the current detecting LED turns OFF, thereby providing notification that the return current I3 is not detected.

Figure 3:
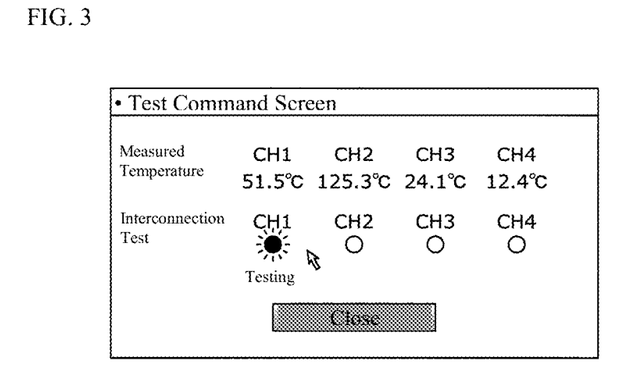
FIG. 3 is an example of an operating screen for a mobile terminal when testing a connection status.
Figure 4:
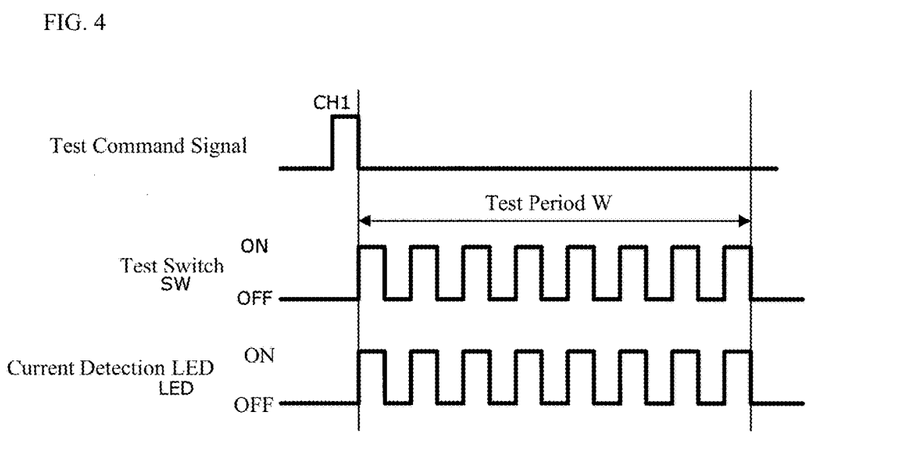
FIG. 4 is a timing chart illustrating switching control of the testing switch when testing the connection status.

FIG. 3 is an example of an operating screen for a mobile terminal when testing a connection status. FIG. 4 is a timing chart illustrating switching control of the testing switch when testing the connection status.

When performing the testing of the connection status, the technician who has gone to the location wherein the temperature sensor 20 is installed selects an arbitrary channel in the operating screen of the mobile terminal 30, illustrated in FIG. 4, to start the testing of the connection status of the temperature sensor 20 that is connected to the selected channel.

If, for example, an operation is performed to select the channel CH1, then, as illustrated in FIG. 4, an test start signal, for directing the testing on CH1, is outputted to the temperature measuring instrument 10 from the mobile terminal 30.

The controlling portion 12 of the temperature measuring instrument 10 receives the test start signal from the mobile terminal 30 through the communication interface portion 13, and outputs, to the detecting portion 11 corresponding to CH1 indicated by the test start signal, control signals for repetitively turning the testing switch SW ON and OFF, with an testing interval W that has been set in advance.

Consequently, if the report that indicates whether or not there is a return current I3 changes through the current detecting LED turning ON/OFF in accordance with switching of the testing switch SW ON/OFF, it is possible to confirm that the signal lines L1, L2, and L3 are connected properly.

Moreover, if, notwithstanding the testing switch SW being turned ON/OFF, the current detecting LED remains either ON or OFF, with no change in the report that indicates that the return current I3 is present or absent, it is possible to confirm that the signal lines L1, L2, and L3 are not connected properly.

Effects of the Example

In this way, the present example is provided with a testing switch SW for controlling the supply of the constant current I1 to the signal line L1 from the constant current source IS1 and the supply of the constant current I2 to the signal line L2 from the constant current source IS2, where, when testing the connection statuses of the signal lines L1, L2, and L3 wherein, when the temperature is being measured, the constant currents I1 and I2 are supplied respectively to the signal lines L1 and L2, the supply of the constant currents I1 and I2 are stopped temporarily, to change the report from the current detecting/reporting portion DN, provided in the temperature sensor 20, for detecting and reporting whether or not there is a return current I3 to the temperature measuring instrument 10 from the signal line L3.

As a result, it is possible to check whether or not the signal lines L1, L2, and L3 are connected properly, through whether or not there is a change in the report from the current detecting/reporting portion DN in accordance with the switching of the testing switch SW ON/OFF, reducing greatly the time and labor required in checking the connections for the temperature sensors 20.

Moreover, in the present example, the current detecting/reporting portion DN detects and reports whether or not there is a return current I3, making it possible to prevent the effects of the current detecting/reporting portion DN on the voltage difference between the signal lines L1 and L2 when measuring the temperature, thus enabling the testing of the connection statuses of the signal lines L1, L2, and L3, without reducing the accuracy of the temperature measurements.

Another Example

Figure 5:
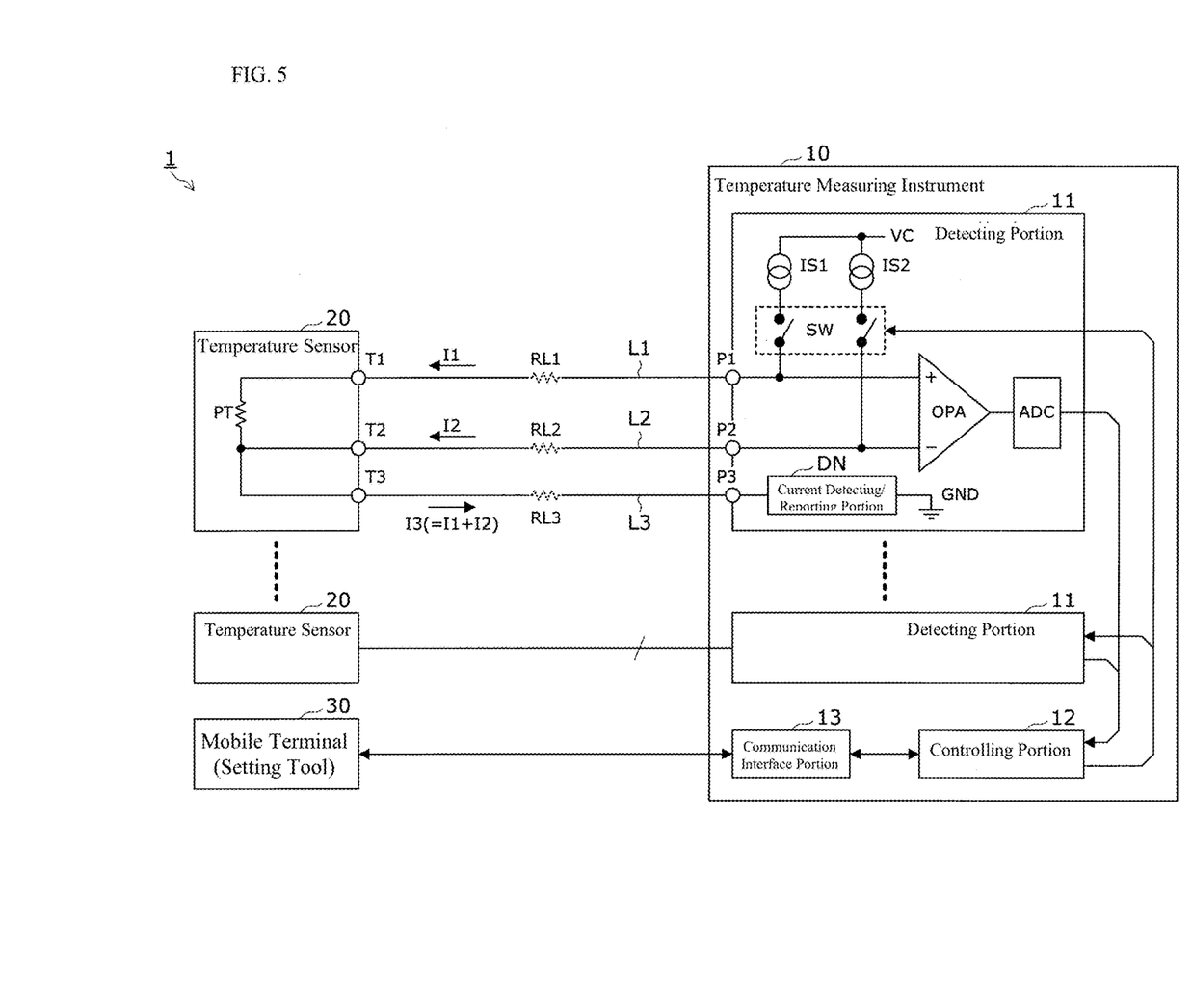
FIG. 5 is a block diagram illustrating a structure of a temperature measuring system according to Another Example.

A temperature measuring system 1 according to Another Example according to the present disclosure will be explained next in reference to FIG. 5. FIG. 5 is a block diagram illustrating a structure of a temperature measuring system according to the Another Example.

While in the Example a case wherein the current detecting/reporting portion DN was provided in the temperature sensor 20 was explained as an example, in the present example the explanation will be for a case wherein current detecting/reporting portions DN are provided in each of the detecting portions 11 of the temperature measuring instrument 10.

As illustrated in FIG. 5, in each detecting portion 11 of the temperature measuring instrument 10 in the present example, a current detecting/reporting portion DN, for detecting and reporting whether or not there is a return current I3 that flows from the signal line L3 into the ground electropotential GND, is provided with the input end thereof connected to the signal line L3 through a terminal T3 and with the output end thereof connected to the ground electropotential GND.

Moreover, in the temperature sensor 20, the other end of the temperature measuring resistive element PT is connected to the signal line L3 through the terminal T3.

In the temperature measuring system 1 according to the present example, the other structures are the same as in the Example, and thus detailed explanations thereof are omitted.

As a result, whether or not there is a return current I3, depending on the ON/OFF switching of the testing switch SW, is reported by the detecting portion 11 of the temperature measuring instrument 10, rather than the temperature sensor 20. This eliminates the need, when testing the connection status, for the technician to visit the location wherein the temperature sensor 20 is detected, thereby greatly reducing the amount of labor.

Moreover, control signals may be outputted sequentially to the detecting portions 11 for the individual channels, in response to a test start signal from the mobile terminal 30, thereby enabling the testing of the connection statuses to be carried out automatically for the temperature sensors 20 that are connected to the individual channels.

Extended Examples

While the present disclosure was explained above in reference to examples, the present disclosure is not limited by the examples set forth above. The structures and details of the present disclosure may be modified in a variety of ways, as can be understood by those skilled in the art, within the scope of the present disclosure. Moreover, the present disclosure may be embodied through combining the various examples, insofar as there are no contradictions.

Moreover, while in the example in FIG. 2 the structure is such that, in the current detecting/reporting portion DN, the entirety of the return current I3 flows through the current detecting LED, the structure instead may be one wherein the current that flows through the current detecting LED is divided through the use of resistive elements, or the like, in a case wherein the magnitude of the return current I3 would exceed the value for the rated current for the current detecting LED.

Moreover, an element or circuit portion wherein a display output or audio output changes depending on whether or not there is a return current I3 may be used instead of a current detecting LED.

Furthermore, in the current detecting/reporting portion DN, the structure may be such that the current value for the return current I3 is compared to an evaluation threshold value, set in advance, and a report is outputted in accordance with the comparison result, rather than depending on whether or not there is a return current I3. This enables a more accurate evaluation of the connection statuses of the signal lines L1, L2, and L3.

The invention claimed is:

1. A temperature measuring system comprising:
   a temperature sensor having a temperature measuring resistive element; and
   a temperature measuring instrument that supplies a constant current to the temperature measuring resistive element through a first signal line connected to one end of the temperature measuring resistive element and second and third signal lines connected to the other end of the temperature measuring resistive element, and outputs a measured temperature based on a voltage difference produced between the first signal line and the second signal line, wherein
   the temperature measuring instrument comprises:
      a first constant current source that supplies a first constant current that returns to the third signal line through the temperature measuring resistive element of the temperature sensor from the first signal line;
      a second constant current source that supplies a second constant current that returns to the third signal line from the second signal line; and
      a testing switch that supplies the first constant current from the first constant current source to the first signal line and the second constant current from the second constant current source to the second signal line,
   the temperature sensor comprises:
      a current detecting/reporting portion that detects and reports whether or not there is a return current from the third signal line to the temperature measuring instrument, and
   the testing switch supplies the first and second constant currents to the first and second signal lines, respectively, when the temperature is being measured, and, when the connection statuses of the first, second, and third signal lines are being tested, temporarily stops the supply of the first constant current and of the second constant current, to change the report from the current detecting/reporting portion.

2. A temperature measuring instrument for supplying a constant current to a temperature measuring resistive element through a first signal line connected to one end of a temperature measuring resistive element of a temperature sensor and second and third signal lines connected to the other end of the temperature measuring resistive element, and for outputting a measured temperature based on a voltage difference produced between the first signal line and the second signal line, the temperature measuring instrument comprising:
- a first constant current source that supplies a first constant current that returns to the third signal line through the temperature measuring resistive element of the temperature sensor from the first signal line;
- a second constant current source that supplies a second constant current that returns to the third signal line from the second signal line; and
- a testing switch that supplies the first constant current from the first constant current source to the first signal line and the second constant current from the second constant current source to the second signal line, wherein
- the testing switch supplies the first and second constant currents to the first and second signal lines, respectively, when the temperature is being measured, and, when the connection statuses of the first, second, and third signal lines are being tested, temporarily stops the supply of the first constant current and of the second constant current, to detect whether or not there is a return current that is returned to the temperature measuring instrument from the third signal line to change a report from a current detecting/reporting portion, provided at the temperature sensor.

* * * * *